United States Patent [19]

Otto et al.

[11] Patent Number: 4,963,823
[45] Date of Patent: Oct. 16, 1990

[54] ELECTRON BEAM MEASURING INSTRUMENT

[75] Inventors: Johann Otto, Bad Toelz; Erich Plies, Munich, both of Fed. Rep. of Germany

[73] Assignee: Siemens Aktiengesellschaft, Berlin and Munich, Fed. Rep. of Germany

[21] Appl. No.: 349,432

[22] Filed: May 9, 1989

[30] Foreign Application Priority Data

Jun. 27, 1988 [DE] Fed. Rep. of Germany ....... 3821643

[51] Int. Cl.$^5$ ............................................. G01R 31/28
[52] U.S. Cl. ................................. 324/158 R; 250/311
[58] Field of Search ............ 324/158 R, 158 D, 73 R, 324/73.1; 250/310, 311, 396 R, 396 ML

[56] References Cited

U.S. PATENT DOCUMENTS 4,214,162  7/1980  Hoppe et al. ........................ 250/311
4,779,046  10/1988  Rouberoi et al. ................ 324/158 R Primary Examiner—Ernest F. Karlsen
Attorney, Agent, or Firm—Hill, Van Santen, Steadman & Simpson

[57] ABSTRACT

Conventional beam blanking system generate electron pulses having a minimum width of about 100 through 200 ps. Although a reduction of the pulse width to a few tens of picoseconds is fundamentally possible, the reduction of the probe current accompanying this would result to a considerable lengthening of the measuring times. In the invention a photo-cathode (PK) is charged by a pulsed laser beam (LA) which is attached to the column of an electron beam measuring instrument and the photo-electron source is stigmatically imaged onto the beam axis (OA1) using a focusing deflection unit (SFM). A sector field magnet is used as a focusing deflection unit (SFM).

28 Claims, 5 Drawing Sheets

ELECTRON BEAM MEASURING INSTRUMENT

BACKGROUND OF THE INVENTION

1. Field of the Invention

This invention relates in general to an electron beam measuring instrument which includes a first electron beam source which is directed on a first beam axis and a second electron beam source arranged on a second beam axis and includes a focusing deflection unit for stigmatic imaging of the second electron beam source in an intermediate image which is on the first beam axis.

2. Description of the Related Art

The publication Microelectronic Engineering, Vol. 7 (1987) pages 163 through 172 discloses an electron beam measuring instrument which is optimized for low accelerating voltages in the range of 0.5–2.5 kV with which the voltage distribution in components of microelectronics can be read with a spatial resolution of about 0.1 $\mu m$ and the voltage waveform at interconnects up to 0.5 $\mu m$ wide can be stroboscopically registered with a temporal resolution of about 100 through 200 ps using the conventional beam blanking system.

The publication Applied Physics Letters 51 (2) 1987, pages 145 through 147 discloses a scanning electron microscope which has a thermal $LaB_6$ or a field emitter gun which are replaced by a photo-cathode charged with a pulsed laser beam with a pulse repetition rate of 100 MHz and a pulse width of 1 through 2 ps. Since the width of the photo-electron pulses which are generated roughly corresponds to the width of the laser pulses which trigger the photo emission, this system is particularly suited for stroboscopic measurements in fast gallium-arsenide circuits having a temporal resolution which lies in the picosecond range. The spatial resolution roughly corresponds to that of the scanning electron microscope which has a conventional beam generator.

The publication Microelectronic Engineering, Vol. 4, No. 2 1986 pages 77 through 106 discloses methods for imaging the voltage distribution in VLSI circuits which require a continuous electron beam or, respectively, a pulsed electron beam which has a comparatively low particularly a variable pulse repetition rate ($fp \approx 1-10$ MHz). These methods which are indispensable for fast testing of the functioning of the microelectronic components can only be poorly implemented with the known electron beam measuring instrument due to the pulse repetition rate which is rigidly prescribed by the laser system.

SUMMARY OF THE INVENTION

It is an object of the present invention to provide electron beam measuring instruments which have two beam axes which allows both imaging methods as well as measurements of the voltage path to be implemented with high spatial and chronological resolution. This object is inventively achieved with an electron measuring instrument which has a first electron beam source arranged on a first beam axis and a second electron beam source arranged on a second beam axis and uses a focusing deflection unit for the stigmatic imaging of the second electron source in an intermediate image which lies on the first beam axis.

The second electron beam source may comprise a photocathode charged by a laser beam. The invention may use a four or six pole element to generate a magnetic quadrupole field so as to correct distortion. A lens OL is used for focusing the laser beam LA onto the photo-cathode PK and a cylindrical-shape lens ZL is arranged in the light optical beam path preceding the lens OL. The laser beam LA may be directed along a third beam axis which describes an angle with the second beam axis. A beam blanking diaphragm VB may be arranged in the beam path preceding the intermediate image.

The photo-cathode PK may be mounted on a carrier TR which is supported on a holder H which is moved by an oscillator PS.

It is an advantage of the invention that both imaging methods as well as measurements of the voltage waveform at interconnects of fast LSI circuits can be carried out in one electron beam measuring instrument with a chronological resolution which is in the picosecond range.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
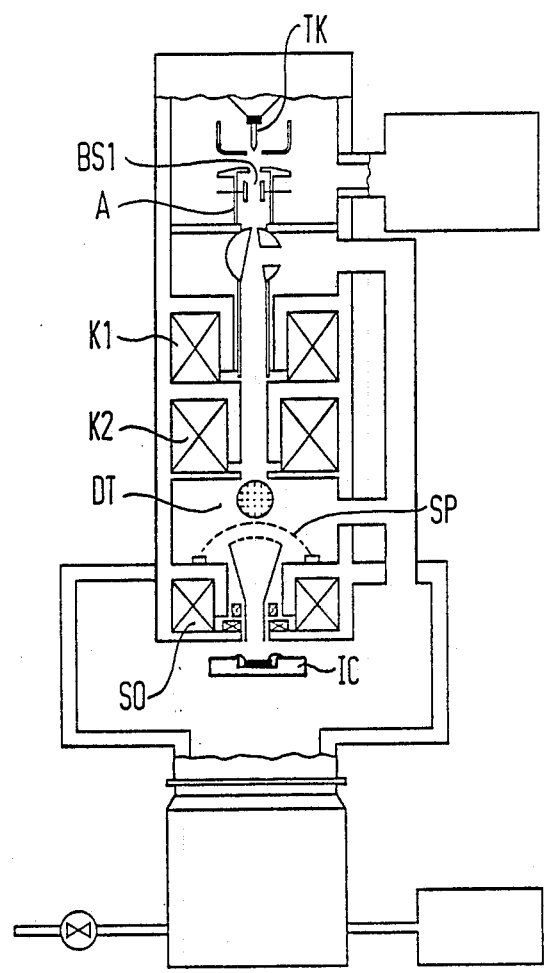
FIG. 1 is a schematic illustration of a prior art known electron beam measuring instrument.

FIG. 1 illustrates a prior art electron beam measuring instrument such as the ICT E-Beam Testing System 9000 which is described in the article referenced above of Microelectronic Engineering. FIG. 1 schematically shows this device which has an outer housing in which a conventional beam generator having a $LaB_6$ cathode TK is mounted so that it is centered on an optical axis. A beam blanking system BS1 is mounted in the housing and integrated into the anode A of the beam generator. An immersion condenser K1 comprises a magnetic lens and an electrostatic two tube lens is mounted about the optical axis through which the beam passes. A second condenser lens K2 and an objective lens SO for focusing the primary electrons onto a component IC which is mounted in the evacuated specimen chamber are also arranged in the housing on the optical axis. The objective lens SO is composed of a short-focus magnetic lens and includes a deflection unit and a stigmator. A spectrometer SP also forms a component of the electro-optical column with which both the primary electrons are decelerated to the desired energy of, for example, 1 keV in the immersion condenser K1 as well as the secondary electrons which are triggered at the measuring point are respectively imaged on a point lying on the optical axis. The focus of the secondary electrons accelerated in the field of an extraction electrode are in the center of a spherically symmetrical electrical retarding field which is built up in a spectrometer component arranged above the objective lens body between two appropriately shaped electrodes as shown. Secondary electrons having energies above the minimum energy established by the spectrometer field are detected in two detectors DT symmetrically arranged relative to the beam axis so as to detect the secondary electrons.

The conventional beam blanking system BS1 has plate capacitors positioned so as to generate electron pulses having a minimum width of 100–200 ps, and the maximum pulse repetition rate is about 10 MHz. Although a reduction of the pulse widths to a few tens ps is fundamentally possible, the reduction of the probe current accompanying this reduction would lead to a considerable lengthening of the measuring times.

Figure 2:
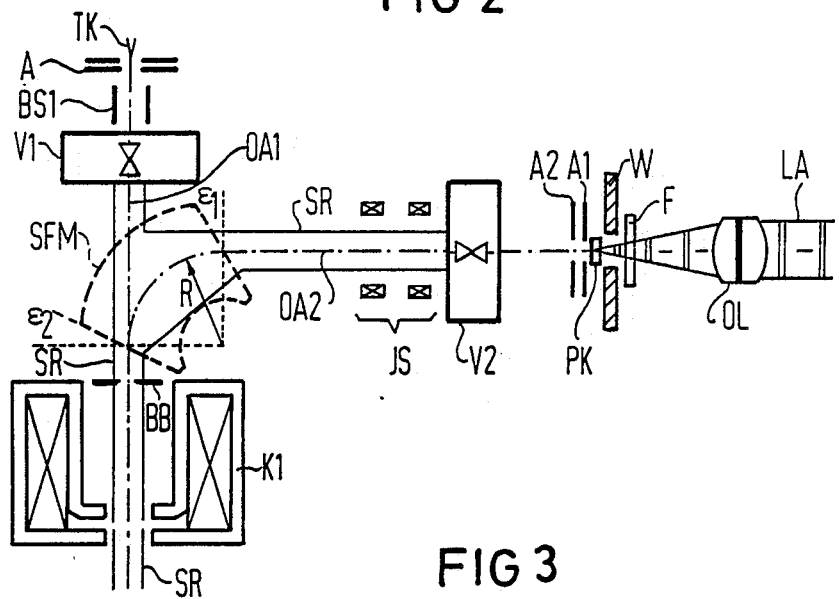
FIG. 2 is a first exemplary embodiment of an electron beam measuring instrument according to the invention.
Figure 4:
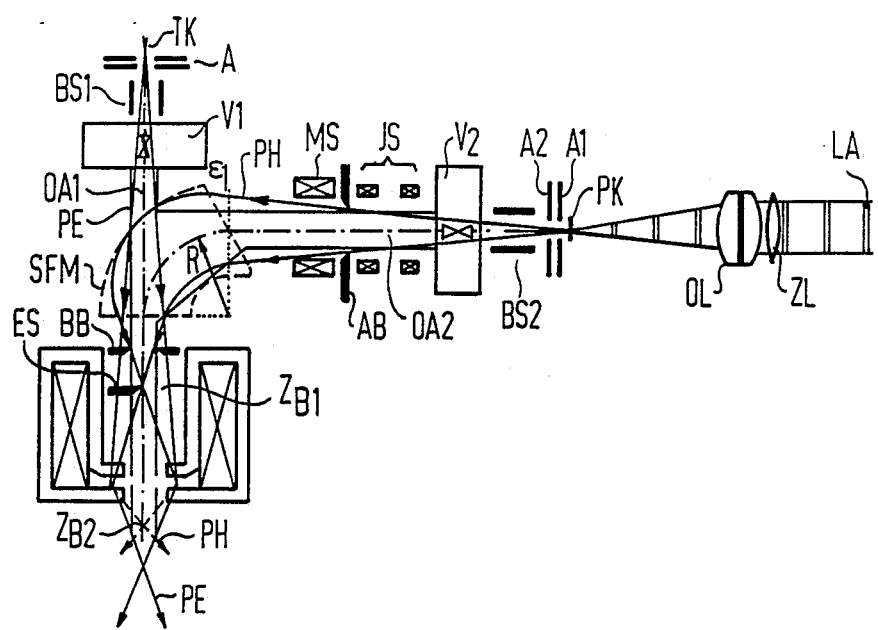
FIG. 4 illustrates a second exemplary embodiment of an electron beam measuring instrument of the invention.

According to the invention, it is proposed to inject laterally an electron beam with a photo-electron source such as shown in FIG. 2 to the column of the known electron beam measuring instrument and to stigmatically image the photo-electron source onto the beam axis OA1 using a focusing deflection unit SFM shown in greater detail in FIG. 4 illustrating the paths of the thermic electrons PE emitted by the LaB$_6$ cathode TK as well as the path of the photo-electrons PA triggered on the photo-cathode PA by the laser beam LA. It is to be realized that the schematic view of FIG. 2 illustrates only that portion of the prior art device above the immersion condenser K1 and that the other components of the invention below the immersion condenser K1 are the same as shown in FIG. 1.

Stigmatic is the property of an optical system whose vocal power is the same in all mediums. In the McGraw Hill Dictionary of Scientific and Technical Terms, Copyright 1974.

Figure 3:
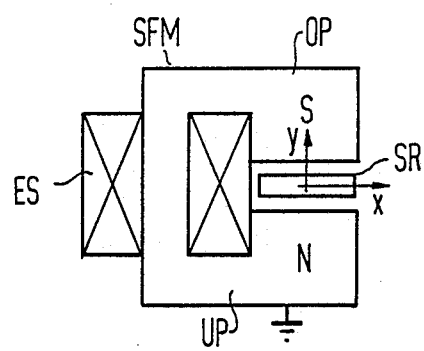
FIG. 3 is a schematic illustration of a focusing deflection unit of the invention.
Figure 9:
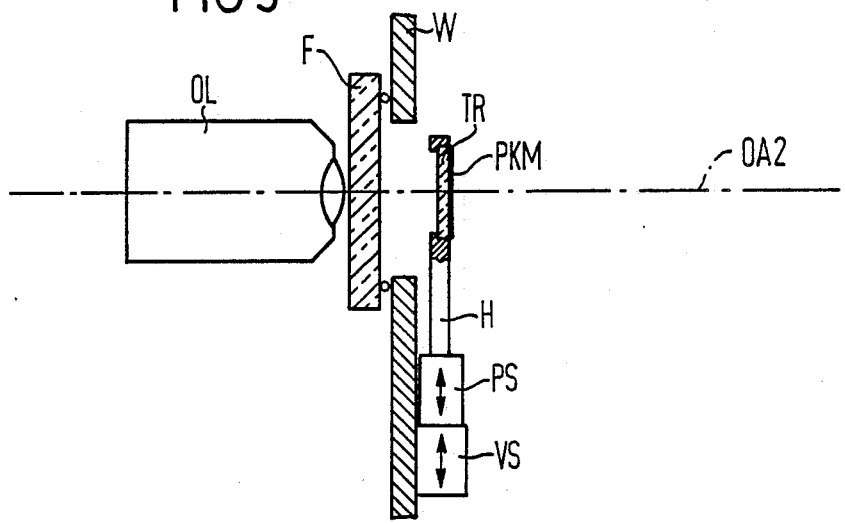
FIG. 9 is a detailed view illustrating the apparatus for displacing the photo-cathode in the laser beam.

As shown in FIGS. 2 and 4, the photo-electron source is composed of a photo-cathode PK which is irradiated by a pulsed laser beam LA. An electrode system comprising double anodes A1 and A2 are also mounted through which the photo-electron beam passes and this double anode accelerates the photo-electrons PH triggered from a precious metal or alkaline metal layer on the photo-cathode PK. The precious metal or alkaline metal layer may be 100–200Å thick. The photo-electrons are directed in the direction of a two stage magnetic adjustment system JS as illustrated. The same as the conventional beam generator, the photo-electron source is mounted in a chamber and a valve V2 separates the high vacuum (pK$\lesssim$5×10 (−5) Pa) generated in the chamber from the vacuum (p$_{sr}$$\lesssim$2×10 (−4) Pa) built up in the beam tube SR. A window F is present in the back chamber wall W and the laser beam LA is imaged through the window F onto the photo-cathode material PKM which might be selected from Au, Na, K, Rb or Cs and which is mounted on a glass carrier TR with the assistance of a highly demagnifying lens OL as illustrated in FIG. 9. A sector field magnet SFM illustrated in FIG. 3 which is formed of an excitation coil ES and has upper and lower pole shoes OP and UP is provided for the deflection and focusing of the photo-electrons PH which are triggered in a pulsed fashion with a pulse repetition rate of $\approx$10–200 MHz and with a pulse width $\approx$2–5 ps. A uniform magnetic sector field having a field limit inclined at the source side of the photo-electron source is built-up in the deflection element which has a radius of R$\approx$25 mm and is arranged between the conventional beam generator TA/A and the immersion condenser K1. The angle $\epsilon_1 > 0$ between the normal at the source side field limiting plane and the beam axis OA2 is set by the pole piece geometry such that a stigmatic imaging of the photo-electron source occurs.

So as to avoid distortion of the first order of the intermediate image ZB1 as shown in FIG. 4 of the photo-electron source onto the beam axis OA1 above the immersion condenser K1, it is necessary to also prescribe the limit of the magnetic sector field at the specimen side by the shape of the pole piece such that the normal at the specimen field limit plane makes an angle $\epsilon_2 > 0$ with the axis OA1 of the electron beam measuring instrument.

Figure 5:
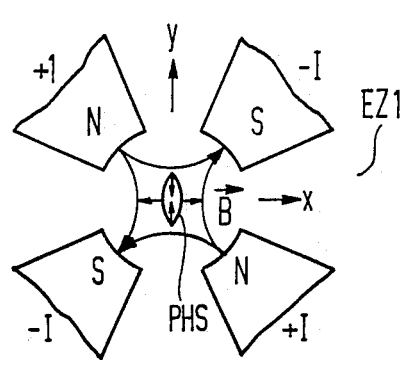
FIG. 5 is a plan view illustrating a correcting means for correcting the distortion of the sector field magnets.
Figure 6:
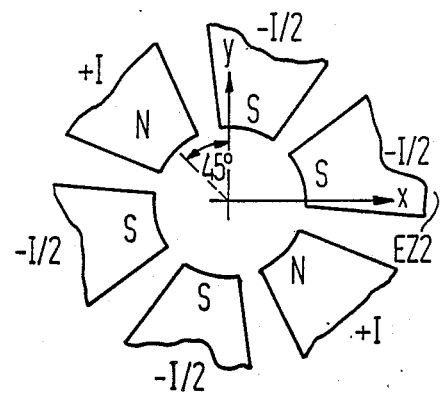
FIG. 6 is a plan view illustrating means for correcting the distortion of the sector field magnets.

When for space reasons, only one sector field magnet wherein $\epsilon_2 = 0$ can be mounted into the column as shown in FIG. 4 then the distortion of the first order must be corrected, for example, using a rectifier arranged at the intermediate image $z_{B1}$ of the photo-electron source. The four-pole or six-pole elements EZ1 or, respectively, EZ2 are schematically shown in FIGS. 5 and 6 can be used as rectifiers and their magnetic quadrupole field B deforms the photo-electron probe PHS so that it is elliptically distorted in the intermediate image $z_{B1}$ in the direction of the arrows illustrated in FIGS. 5 and 6 such that the probe cross-section is rotation symmetrical in the intermediate image $z_{B2}$ generated by the immersion condenser K1.

The distortion of the magnetic field sector can also be corrected by providing that an elliptical laser beam spot is generated on the photo-cathode PK instead of a circular laser beam spot. This can be accomplished using a cylindrical lens ZL which is mounted in the illumination beam path of the laser or with a laser beam LA that obliquely impinges upon the photo-cathode PK. The angle described by the laser beam axis and the normal of the photo-cathode surface is selected such that $$a/b = V_x/V_y$$

is valid whereby a represents the large major axis of the elliptical laser beam spot in the x direction and b references the small major axis. $V_x$ represents the magnification of the sector field magnet SFM in the x-z deflection plane and $V_y$ represents the magnification in the y-z section plane ($|V_x| < |V_y|$).

Figure 7:
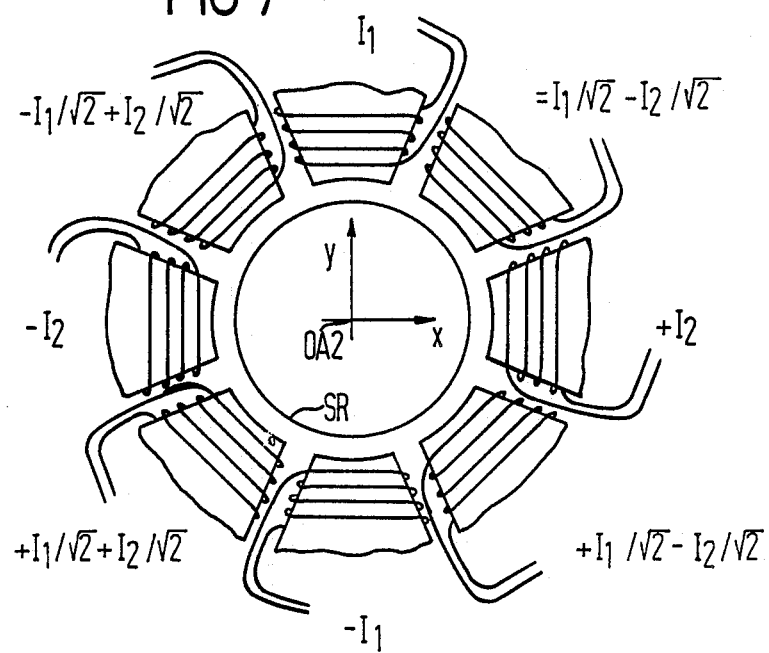
FIG. 7 is a plan view illustrating a stigmator for partial correction of the spherical aberration of the sector field magnets.

As in every imaging system, the sector field magnet SFM has a spherical aberration that can be at least partially corrected by an adjustable magnetic stigmator MS mounted in the beam path before the deflection unit. An eight-pole magnetic element which is schematically shown in FIG. 7 can be used as a stigmator MS which generates both a rotatable dipole field for beam deflection and a rotatable two-fold quadrupole field to correct the astigmatism of the first order and provides as well two super-imposed hexapole fields to partially correct the spherical aberration of the second order having the form $$B_x = 2C_1 \cdot x \cdot y + C_2 \cdot (x^2 - y^2)$$

$$B_y = C_1 \cdot (x^2 - y^2) - 2C_2 \cdot x \cdot y$$

in the beam tube SR. The relationship $$C_1 \sim I_1$$

$$C_2 \sim I_2$$

is thus valid for the constants $C_1$ and $C_2$, where $I_1$ and $I_2$ represent the currents flowing in the excitation windings. The spherical aberration can also be considerably reduced by an aperture diaphragm AB having an aperture diameter of about 200 μm through 1 mm which is arranged in the beam path before the sector field magnet SFM and particularly which is before the stigmator MS.

Figure 8:
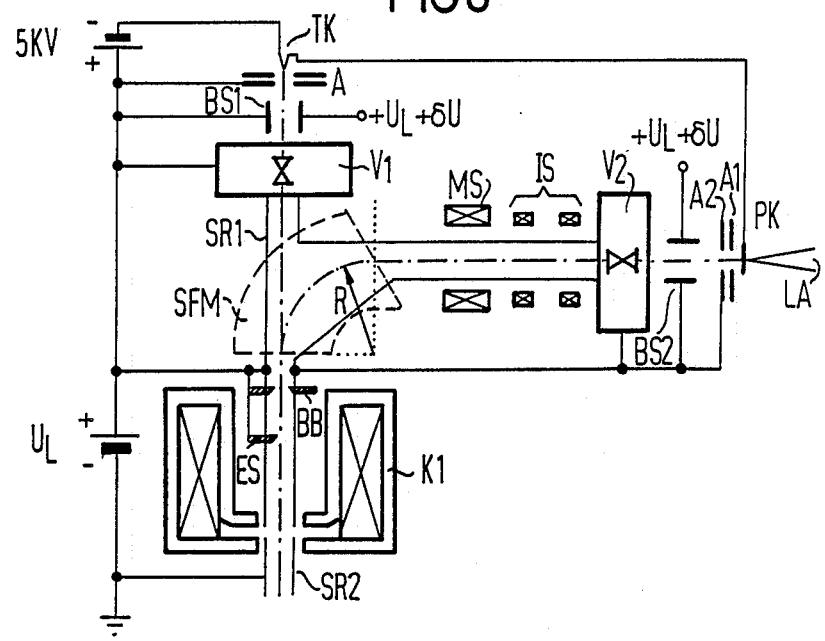
FIG. 8 is a view which illustrates the voltage relationships within an electron beam measuring instrument of the invention.

The knife edge or, respectively, slit diaphragm ES mounted in the intermediate image $z_{B1}$ in the photo-electron source serves for reducing the energy width of the photo-electrons PH. As shown in FIG. 8, this energy selecting means is at a high voltage just like the second beam blanking system VS2 for reduction of the repetition rate of the photo-electron pulses. The beam blanking diaphragm BB is mounted in the beam path before the immersion condenser K1 and after the upper beam tube SR1 and the valves V1 and V2 so that the difference and potential built-up between the electrodes SR1 and SR2 of the electrostatic two tube lens is, for example, $U_L = 4$ kV.

So as to lengthen the useful life of the photo-cathode PH, the glass member TR carrying the precious metal or, respectively, alkaline metal layer PH which is 100–200Å thick may be moved as shown in FIG. 9 in the laser beam LA which is incident through the chamber window F. For this purpose, a piezoelectric oscillator PS serves as a drive unit and it can be energized to periodically displace the holder H carrying the photo-cathode TR/PM in a plane which is perpendicular relative to the beam axis OA2 and may have a frequency of, for example, 1 kHz. When the photo-cathode material PKM is applied in the region illuminated by the laser beam LA, the adjustment VE which is also piezoelectric is activated so as to displace the glass carrier TR and the piezoelectric oscillator PS in the direction indicated by the arrow.

The invention is not limited to the described exemplary embodiments. Thus, it is possible to replace the uniform magnetic sector field having a field limit plane inclined at the source side with an oblique beam entrance by a non-uniform magnetic sector field having a field gradient with the field index $n = \frac{1}{2}$.

Although the invention has been described with respect to preferred embodiments, it is not to be so limited as changes and modifications can be made which are within the full intended scope of the invention as defined by the appended claims.

We claim:

1. An electron beam measuring instrument for examination of a specimen comprising, a first electron source (TK) producing a first beam and mounted on a first beam axis (OA1), a first beam blanking system (BS1) through which said first beam passes, a beam blanking diaphragm (BB) mounted on said first beam axis, at least one condenser lens (K1, K2) including an objective lens (SO) for focusing the electrons (PE) which are guided along the first beam axis (OA1) onto said specimen (IC), a spectrometer detector system (SO, DT) for the documenting secondary and back-scattered particles triggered at the specimen (IC), a second electron source mounted on a second beam axis (OA2), means for stigmatic imaging the second electron source onto the first beam axis (OA1).

2. An electron beam measuring instrument according to claim 1, wherein said second electron source comprises a photo-cathode (PK) charged by a laser beam (LA).

3. An electron beam measuring instrument according to claim 1, wherein said means for stigmatic imaging (SFM) is mounted between said first electron source (TK) and said condenser lens (K1).

4. An electron beam measuring instrument according to claim 1 including a sector field magnet (SFM) which serves as said means for stigmatic imaging.

5. An electron beam measuring instrument according to claim 4, wherein said sector field magnet (SFM) comprises an excitation coil (ES), an upper (OP) and a lower (UP) pole piece, and the pole pieces (OP, UP) are shaped such that a first normal at the source-side field limiting plane has an angle $\epsilon_1 > 0$ with the second beam axis (OA2).

6. An electron beam measuring instrument according to claim 5, comprising a means (EZ1, EZ2) for correcting the distortion of the sector field magnet (SFM), said means being arranged in the intermediate image ($z_{B1}$).

7. An electron beam measuring instrument according to claim 6, comprising a four-pole or six-pole element (EZ1, EZ2) for generating a magnetic quadrupole field as a means for correcting distortion.

8. An electron beam measuring instrument according to claim 5, comprising a lens (OL) for focusing the laser beam (LA) onto the photo-cathode (PK), and a cylinder lens (ZL) mounted in the light-optical beam path preceding said lens (OL).

9. An electron beam measuring instrument according to claim 5, wherein the laser beam (LA) is guided along a third beam axis, and whereby said third beam axis has an angle other then zero with said second beam axis (OA2).

10. An electron beam measuring instrument according to claim 5, wherein the pole pieces (OP, UP) are shaped so that a second normal at the specimen-side field limiting plane describes an angle $\epsilon_2$ greater than zero with the first beam axis (OA1).

11. An electron beam measuring instrument according to claim 1 including a diaphragm or a knife edge (ES) mounted in the intermediate image ($z_{B1}$).

12. An electron beam measuring instrument according to claim 1 comprising a magnetic hexapole correction (MS) mounted in the beam path preceding the deflection element (SFM).

13. An electron beam measuring instrument according to claim 1 wherein an apertured diaphragm (AB) is mounted in the beam path before the deflection element (SFM).

14. An electron beam measuring instrument according to claim 1 including a two-stage magnetic adjustment system (JS) mounted in the beam path before the said means for stigmatic imaging (SFM).

15. An electron beam measuring instrument according to claim 1 including a second beam blanking system (BS2) mounted in the beam path before said means for stigmatic imaging (SFM).

16. An electron beam measuring instrument according to claim 1 wherein the beam blanking diaphragm (BB) is mounted in the beam path before the intermediate image ($z_{B1}$).

17. An electron beam measuring instrument according to claim 1 wherein the photo-cathode (PK) is mounted on a carrier (TR) and the carrier is mounted on a holder (H) which is moved by an oscillator (PS).

18. An electron beam measuring instrument according to claim 1 wherein the first beam axis (OA1) and the second beam axis (OA2) make an angle of 90°.

19. An electron beam measuring instrument according to claim 2, wherein said means for stigmatic imaging (SFM) is mounted between said first electron source (TK) and said condenser lens (K1).

20. An electron beam measuring instrument according to claim 2 including a sector field magnet (SFM) which serves as said focusing deflection element.

21. An electron beam measuring instrument according to claim 2 including a diaphragm or a knife edge (ES) mounted in the intermediate image ($Z_{B1}$).

22. An electron beam measuring instrument according to claim 2 comprising a magnetic hexapole correction (MS) mounted in the beam path preceding said means for stigmatic imaging (SFM).

23. An electron beam measuring instrument according to claim 2 wherein an apertured diaphragm (AB) is mounted in the beam path before said means for stigmatic imaging (SFM).

24. An electron beam measuring instrument according to claim 2 including a two-stage magnetic adjustment system (JS) mounted in the beam path before said means for stigmatic imaging (SFM).

25. An electron beam measuring instrument according to claim 2 including a second beam blanking system (BS2) mounted in the beam path before means for stigmatic imaging (SFM).

26. An electron beam measuring instrument according to claim 2 wherein the beam blanking diaphragm (BB) is mounted in the beam path before the intermediate image ($z_{B1}$).

27. An electron beam measuring instrument according to claim 2 wherein the photo-cathode (PK) is mounted on a carrier (TR) and the carrier is mounted on a holder (H) which is moved by an oscillator (PS).

28. An electron beam measuring instrument according to claim 2 wherein the first beam axis (OA1) and the second beam axis (OA2) make an angle of 90°.

* * * * *